US 6,693,572 B1

(12) United States Patent
Oliaei et al.

(10) Patent No.: US 6,693,572 B1
(45) Date of Patent: Feb. 17, 2004

(54) DIGITAL TUNING SCHEME FOR CONTINUOUS-TIME SIGMA DELTA MODULATION

(75) Inventors: Omid Oliaei, Schaumburg, IL (US); Matthew R. Miller, Palatine, IL (US); Patrick L. Rakers, Kildeer, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/358,055

(22) Filed: Feb. 4, 2003

(51) Int. Cl.$^7$ ................................................. H03M 3/00

(52) U.S. Cl. ...................... 341/143; 341/118; 341/120; 341/155

(58) Field of Search ................................ 341/118, 120, 341/143, 155

(56) References Cited

U.S. PATENT DOCUMENTS

| | | | | |
|---|---|---|---|---|
| 5,039,989 A | * | 8/1991 | Welland et al. | 341/143 |
| 5,079,550 A | * | 1/1992 | Sooch et al. | 341/143 |
| 5,198,817 A | * | 3/1993 | Walden et al. | 341/143 |
| 5,729,230 A | * | 3/1998 | Jensen et al. | 341/143 |
| 5,805,093 A | * | 9/1998 | Heikkila et al. | 341/143 |
| 5,974,089 A | * | 10/1999 | Tripathi et al. | 375/247 |
| 5,986,598 A | * | 11/1999 | Mittel | 341/143 |
| 6,414,615 B1 | * | 7/2002 | Cheng | 341/143 |

OTHER PUBLICATIONS

Cauwenberghs and Temes, "Adaptive digital correction of analog errors in MASH ADC's—Part I; off line and blind on–line calibration," *IEEE Transactions on Circuits and Systems—II: Analog and Digital Signal Processing*, 47:621–628, 2000.

Harjani and Lee, "FRC: A method for extending the resolution of Nyquist rate converters using oversampling," *IEEE Transactions on Circuits and Systems—II: Analog and Digital Signal Processing*, 45:482–494, 1998.

Huang and Lee, "A1.2V direct background digital tuned continuous–time bandpass sigma–delta modulator," *ESSCIRC 2001 Presentations 27th European Solid–State Circuits* Conference Villach, Austria, Sep. 18–20, 2001.

Kiss et al., "Adaptive digital correction of analog errors in MASH ADC's—Part II: correction using test–signal injection," *IEEE Transaction on Circuits and Systems—II: Analog and Digital Signal Processing*, 47:629–638, 2000.

Luh et al., "A 400 MHz 5$^{th}$–order CMOS continous–time switched–current ΣΔmodulator," *Proceedings of the European Solid–State Circuits Conference*, Sep. 2000.

Petrie and Miller, "A background calibration technique for multibit delta–sigma modulators," *IEEE International Symposium on Circuits and Systems*, 2:29–32, 2000.

(List continued on next page.)

Primary Examiner—Michael Tokar
Assistant Examiner—Khai M. Nguyen
(74) Attorney, Agent, or Firm—Fulbright & Jaworksi, LLP (57) ABSTRACT

Systems and methods are described for a digital tuning scheme for continuous-time sigma-delta modulation. The method includes integrating a voltage from a voltage source using a discrete-time integrator to produce a discrete-time integrator output, continuous-time integrating a current from a controllable current source to produce a continuous-time integrator output, quantizing the difference between the continuous-time integrator output and the discrete-time integrator output to produce a quantizer output, controlling a polarity of the controllable current source with the quantizer output, counting the quantizer output to produce a feedback signal, and tuning the controllable current source as a function of the feedback signal.

15 Claims, 5 Drawing Sheets

OTHER PUBLICATIONS

Raghavan et al., "Architecture, design, and test of continuous–time tunable intermediate–frequency bandpass delta–sigma modulators," *IEEE J. of Solid–State Circuits*, 36:5–13, 2001.

Robert et al., "A 16–bit low–voltage CMOS A/D converter," *IEEE J. of Solid–State Circuits*, SC–22:157–163, 1987.

Sarhang–Nejad and Temes, "A high–resolution mulbit ΣΔADC with digital correction and relaxed amplifier requirements," *IEEE J. of Solid–State Circuits*, 28:648–660, 1993.

Shoaei and Snelgrove, "Design and implementation of a tunable 40 Mhz–70 MHz Gm–C bandpass ΣΔmodulator," *IEEE Transaction on Circuits and Systems—II: Analog and Digital Signal Processing*, 44:521–530, 1997.

Silva–Martinez et al., "A 10.7–MHz 68–db SNR CMOS continous–time filter with on–chip automatic tuning," *IEEE J. Solid–State Circuits*, 27:18431853, 1992.

Viswanathan et al., "Switched–capacitor frequency control loop," *IEEE J. of Solid State Circuits*, SC–17:775–778, 1982.

* cited by examiner

DIGITAL TUNING SCHEME FOR CONTINUOUS-TIME SIGMA DELTA MODULATION

BACKGROUND OF THE INVENTION

1. Field of the Invention

The invention relates generally to the field of analog to digital sigma-delta signal conversion.

2. Discussion of the Related Art

Discrete-time (DT) sigma-delta modulators have been successfully implemented using the switched-capacitor technique during the past decade. In a switched-capacitor implementation of a sigma-delta modulator, integrators are required to settle with an adequately small error at the end of each clock phase. This calls for fast amplifiers and thereby increased power dissipation. A second drawback of the switched-capacitor approach is aliasing of thermal noise and consequently increased in-band noise. Continuous-time (CT) sigma-delta modulation is an alternative way of converting analog signals to digital without the above-mentioned drawbacks. In CT-modulators, all integrators operate in the continuous-time domain and sampling occurs at the same time as quantization. As a consequence, CT-modulators are less demanding in terms of biasing current. Moreover, they provide an anti-aliasing filter without additional cost.

Despite their advantages, development of CT-modulators has been hindered by many practical issues, such as sensitivity to clock jitter, sensitivity to the shape of the feedback signal and inaccuracy of coefficients, all of which can result in inaccuracies in the outputs of CT-modulators.

Inaccuracy of coefficients stems from the fact that in a continuous-time structure such coefficients are set by two independent physical quantities such as resistance and capacitance. As a consequence, deviation of the coefficients from their nominal values can be as high as ±50%. Moreover, the value of the coefficients is prone to further variations due to temperature and aging. On the contrary, coefficients in a discrete-time system are set by the ratio of two devices of the same type, for example, capacitors. This shortcoming of continuous-time structures calls for a tuning scheme which should adjust some controllable variables in the system. A wide variety of tuning techniques for continuous-time filters can be found in the literature.

Inaccuracy of coefficients in a CT-modulator may cause several undesirable effects. The most obvious is departure of the loop function from its nominal characteristic and thereby degradation of noise shaping. The second problem is related to the dynamic range of the system and the maximum allowable swing of its internal nodes. This could result in harmonic distortion because of clipping and reduced dynamic range.

SUMMARY OF THE INVENTION

There is a need for the following embodiments. Of course, the invention is not limited to these embodiments.

In accordance with one aspect of the invention, a method for tuning a continuous-time modulator includes supplying a controllable current source, integrating a voltage from a voltage source using a discrete-time integrator to produce a discrete-time integrator output, continuous-time integrating the current from the controllable current source to produce a continuous-time integrator output, quantizing the difference between the continuous-time integrator output and the discrete-time integrator output to produce a quantizer output, controlling the polarity of the controllable current source with the quantizer output, counting the quantizer output to produce a feedback signal, and tuning the controllable current source as a function of the feedback signal.

In accordance with another aspect of the invention, an apparatus for a continuous-time modulator tuning circuit includes a switched-capacitor integrator in a fixed forward path, a continuous-time integrator in a feedback path, a quantizer coupled to receive input from the switched capacitor integrator and the continuous-time integrator, a counter coupled to receive input from the quantizer, a controllable current source coupled to receive input from the counter and to provide input to the continuous-time integrator, and an input voltage coupled to provide input to the switched-capacitor integrator.

These and other features and embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/ or rearrangements.

BRIEF DESCRIPTION OF THE DRAWINGS

The drawings accompanying and forming part of this specification are included to depict certain aspects of the invention. The invention may be better understood by reference to one or more of these drawings in combination with the description presented herein. It should be noted that the features illustrated in the drawings are not necessarily drawn to scale.

DETAILED DESCRIPTION

Calibration or tuning of continuous-time (CT) filters has been an active field of research for many years. All these techniques lead to trimming, or adjusting by electronic means, the value of capacitors, resistors or transconductors in the circuit in order to preserve the frequency response of the filter. On the other hand, different methods of calibration and correction have been investigated for discrete-time sigma-delta modulators. These methods are particularly used when the structure is sensitive to imperfections of the analog implementation. In this sense, calibration methods find their main application in multibit and cascade modulators.

Tuning of CT-modulators has been usually addressed only in the case of bandpass modulators. Tuning for lowpass CT-modulators has been reported only for a high-order system. All these tuning schemes for CT-modulators are fundamentally similar to what is used for CT-filters.

Figure 1:
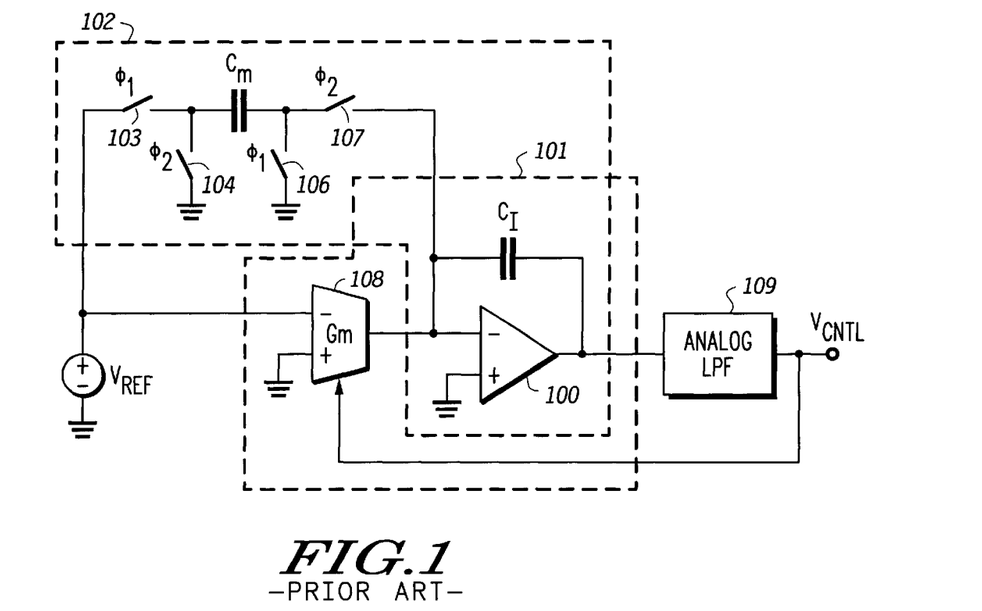
FIG. 1 is a prior art switched-capacitor based tuning circuit for continuous-time filters.

A precise tuning of a continuous-time integrator can be achieved if an accurate time reference is available. In this case, a switched capacitor, including capacitor $C_m$ and switches 103, 104, 106, and 107 operates as a resistor and the tuning circuit tries to match the continuous-time integrator 101 and switched-capacitor integrator 102, as shown in FIG. 1. The two integrators 101, 102 may be matched by adjusting their respective equivalent resistances.

In FIG. 1, a reference voltage $V_{ref}$ is coupled to an operational transconductance amplifier (OTA) Gm and to a switch 103. The switch 103 is also coupled to a switch 104 and a capacitor $C_m$. The capacitor $C_m$ is coupled to switch 106 and a switch 107. Switches 106 and 104 are grounded. Switch 107 is coupled to the output of the OTA Gm and to a capacitor $C_I$, which is also coupled to the output of an operational amplifier (op-amp) 100. The output of the OTA Gm is coupled to an inverting input of the op-amp 100. The non-inverting input of op-amp 100 is grounded. The output of op-amp 100 is coupled to an analog LPF (low-pass filter) 109 which outputs a control voltage $V_{cntl}$.

The transconductance of the continuous-time integrator 101 is continuously changed so that at steady state its value becomes equal to $f_{clk}C_m$, where $f_{clk}$ is the frequency of clock controlling $\Phi 1$ and $\Phi 2$. This tuning scheme does not require any external component. Other variants of this circuit also exist.

However, this prior-art switched-capacitor technique, as shown in FIG. 1, cannot be directly used for continuous-time $\Sigma\Delta$-modulators when high accuracy is needed. This is due to the fact that the control voltage $V_{cntl}$ generated by the tuning circuit is analog. The transconductors controllable by an analog voltage are mainly active circuits with poor linearity. Low harmonic distortion, e.g., less than 90 dB, can be achieved only by passive devices. Passive devices are those which do not require a biasing current for their operation. Changing the value of a passive element, such as a resistor, may require a digital control signal.

Figure 2:
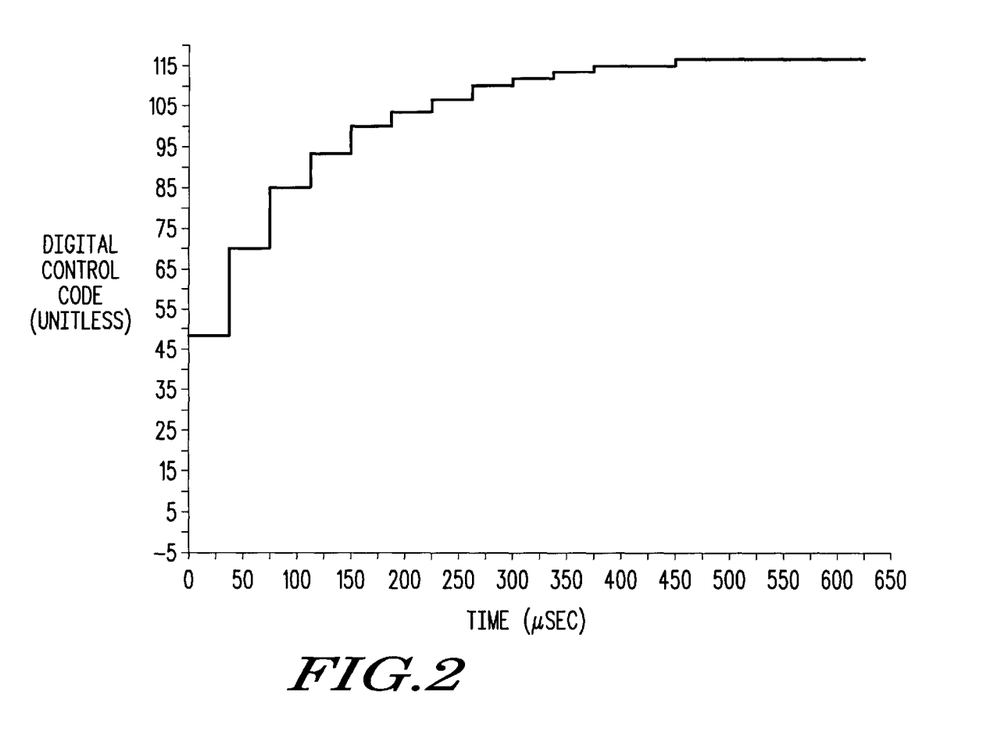
FIG. 2 is a graph showing the tuning transient characteristics of a tuning circuit, in accordance with an embodiment of the present invention, as related to the length of the measurement cycle, shown in $\mu$sec.

One such digital control signal can be generated by a measurement and tuning system. An example of this is shown in the graph of FIG. 2. The graph shows tuning transient characteristics of a tuning circuit, in accordance with an embodiment of the present invention, as related to the length of the measurement cycle, shown in $\mu$sec on the x-axis. The vertical axis, or y-axis shows the decimal representation of the digital (control) code generated by a counter.

Figure 3:
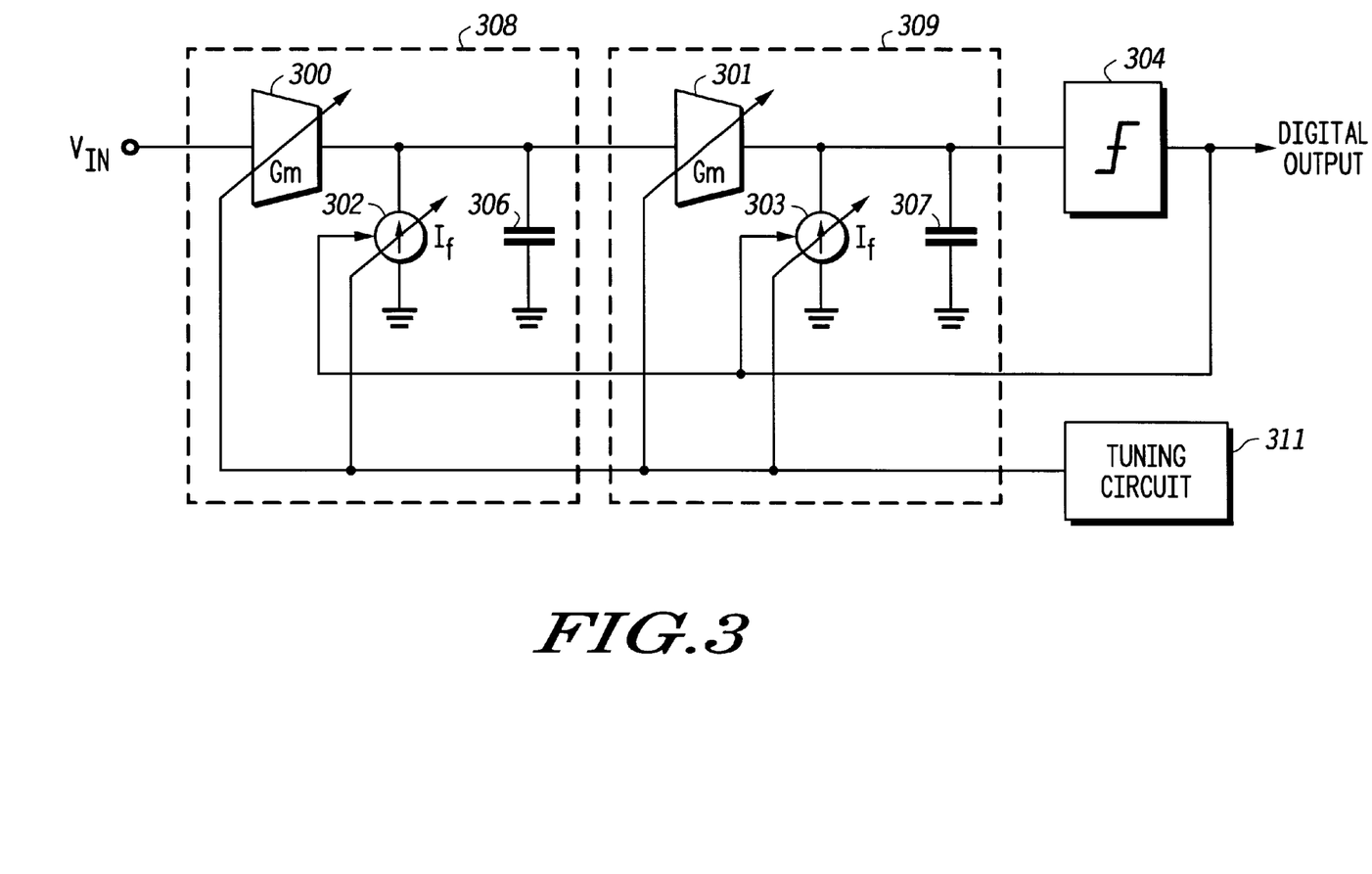
FIG. 3 is a continuous-time sigma-delta-modulator, in accordance with an embodiment of the present invention.
Figure 4:
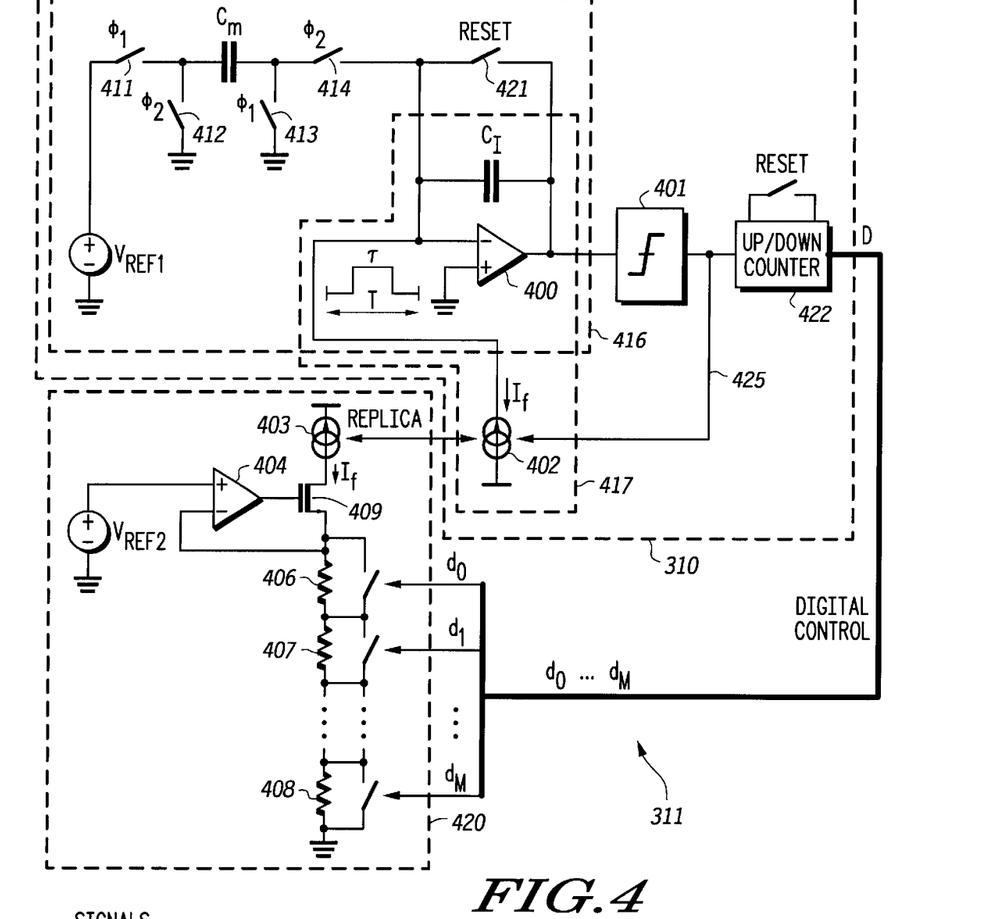
FIG. 4 is a tuning circuit, in accordance with an aspect of the present invention.

In a subsequent step after the measurement process, the counter output is used to change the value of $I_f$ by means of a circuit similar to the tuning circuit 311, shown in FIGS. 3–4. Therefore, during the measurement cycle the value of $I_f$ is kept constant. The measurement and correction steps are repeated several times to ensure the convergence of the algorithm, as shown, for example, in FIG. 2. This tuning method may end when the current source no longer changes during successive iterations of the measurement and correction steps. The final digital code will be stored and used during the normal operation of the main continuous-time $\Sigma\Delta$-modulator.

FIG. 3 depicts an example of such a tuning system generating the required digital control signal. The system is reset at the beginning of the measurement cycle and then it is clocked N times. Simple analysis allows one to establish the following equation:

$$V_{ref} = \frac{I_f \tau \sum_{n=0}^{N-1} D_i}{C_m N} + \frac{V_0(N) - V_0(0)}{N}$$

where $V_0(O)$ and $V_0(N)$ are the amplifier output at the beginning and at the end of the measurement process, respectively. T is the clock period of a clock signal, $\tau$ the current pulse-width, $D_i$ the counter output and N the number of clocks. If the number of clocks N is large enough:

$$V_{ref} \approx \frac{I_f \tau \sum_{n=0}^{N-1} D_i}{C_m N} \text{ or } I_f = \frac{C_m V_{ref}}{\tau D_{avg}}$$

where $D_{avg}$ is defined as:

$$D_{avg} = \frac{1}{N} \sum_{n=0}^{N-1} D_i$$

Thus, the counter output provides an estimation of $I_f$ the accuracy of which depends on N: the longer the measurement cycle, the better the accuracy.

The transfer function of the continuous-time integrator may then be written as a function of $I_f$, where the coefficient that is of concern is $I_f\tau/Cm$:

$$H(s) = \left(\frac{I_f \tau}{C_m}\right)\left(\frac{1}{s}\right) = \left(\frac{V_{ref}}{D_{avg}}\right)\left(\frac{1}{s}\right)$$

or the transfer function may be written as a function of Gm, where the coefficient that is of concern is Gm/Cm:

$$H(s) = \left(\frac{Gm}{C_m}\right)\left(\frac{1}{s}\right) = \left(\frac{V_{ref}}{D_{avg}}\right)\left(\frac{1}{s}\right)$$

Therefore, the digital code provided by the counter gives also the transfer function of the continuous-time integrator. One aspect of the present invention addresses the inaccuracy of coefficients which is common to all continuous-time circuits including filters and converters.

In accordance with the present invention and the tuning system described previously, digital calibration is used for adjusting the coefficients $I_f\tau/Cm$ or Gm/Cm in a CT-sigma-delta modulator. Without tuning, both the transconductor and current sources in the CT-sigma-delta modulator may be inaccurate. FIG. 3 is a general illustration of a CT-sigma-delta modulator with digital tuning in accordance with one aspect of the present invention, in this case, digital calibration of the current source $I_f$ and Gm. FIG. 3 shows a second-order CT-sigma-delta modulator using OTAs in accordance with one embodiment of the present invention. The invention may also be implemented with operational amplifiers.

In this embodiment of the invention, the GmC-integrator 308 at the controllable OTA 300 receives input as $V_{in}$. The output of the controllable OTA 300 is coupled to a controllable current source 302 and a capacitor 306 and becomes the input to a second controllable OTA 301. The output of the second controllable OTA 301 is coupled to a second controllable current source 303 and a second capacitor 307 and becomes the input into a quantizer 304. The output of the quantizer 304 is the output of the CT-sigma-delta-modulator and is fed back to the circuit through current source 302, 303. The two controllable OTAs 300, 301 and controllable current sources 302, 303 also receive input from the tuning circuit 311, which adjusts their respective values. The controllable OTAs 300, 301 and current sources 302, 303 are circuit elements whose outputs are variable according to their inputs.

The tuning circuit 311 shown in FIG. 3, an example of which is shown in FIG. 4, through replication of the controllable current sources 302, 303, measures the coefficients of the main CT-sigma-delta-modulator, as shown and described in more detail in Examples 1 and 2, in this case, $I_f/C$, and digitally adjust them so that the gain of the continuous-time integrator matches the gain of a more accurate switched-capacitor integrator (SC-integrator).

An embodiment of the tuning circuit 311 is depicted in FIG. 4. The task of the system is measurement and digital adjustment of the controllable current source $I_f$. This controllable current source is the same or a replica of the current source used in the main ΣΔ-modulator shown in FIG. 3. The controllable current source may be replicated using a current mirror or other methods as long as the output currents of the controllable current sources are equivalent to each other. The measurement system in FIG. 4 is based on an incremental analog-to-digital converter. An incremental converter may be a sigma-delta modulator with a reset at the beginning of each conversion cycle. The circuit is also functional without the reset switch, but a larger tuning uncertainty will result.

Figure 5:
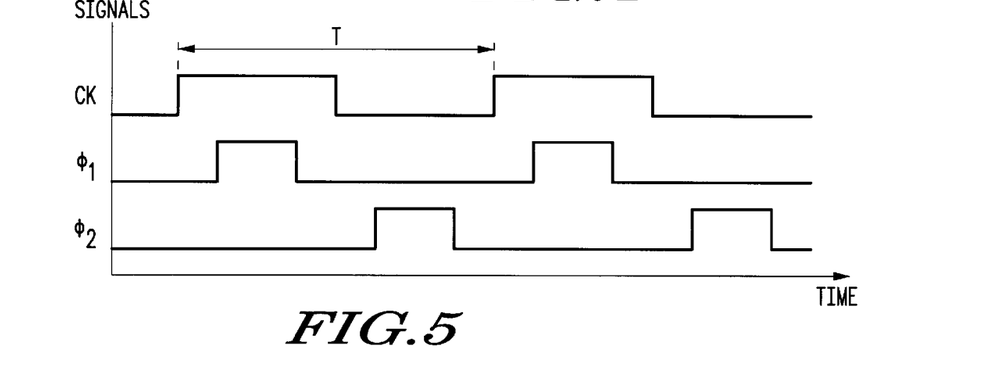
FIG. 5 is a timing diagram for the switches in the digital tuning circuit, in accordance with an aspect of the present invention.

As shown in FIG. 4, the system is composed of a digital tuning circuit 310 and a controllable current source 420. The digital tuning circuit 310 comprises a continuous-time-integrator 417 and a discrete-time/switched-capacitor integrator 416. The SC-integrator 416 is comprised of a reference voltage $V_{ref1}$ coupled to switch 411, which is coupled, at its other end, to switch 412 and capacitor $C_m$. $C_m$ is coupled to switch 413 and switch 414. Switches 413 and 412 are grounded. Switch 414 is coupled to a Reset switch 421 that is coupled in parallel to capacitor $C_1$, and both are coupled to both the input and the output of the operational amplifier 400. The timing diagram for switches 411–414 is shown in FIG. 5, where Ck is the clock signal, Φ1 and Φ2 denotes the timing signal for each of the switches, and T is one clock cycle. The clock signal is generated by a clock generator that is not shown here in FIG. 4. As shown in FIG. 5, switches 411, 413 and switches 412, 414 are not switched on at the same time. When one set of switches is turned off, the other set of switches is turned on.

The continuous-time integrator 417 found in the digital tuning circuit 310 comprises the capacitor $C_I$ coupled to the input and the output of the operational amplifier 400. At the input of the operational amplifier 400, capacitor $C_1$ is also coupled to a current source $I_f$ 402.

The digital tuning circuit may be an implementation of a ΣΔ-modulator. The output of the operational amplifier 400 is coupled to a quantizer 401 whose output is coupled to both an Up/Down Counter 422 and to the current source $I_f$ 402. The output 425 coupled to the current source $I_f$ may be passed through a logic block to control a polarity of the current source $I_f$ 402. This may be implemented to assure that the continuous-time integrator functions in a closed system, wherein if the quantizer 401 outputs a digital signal of 1, the current source $I_f$ 402 would receive a digital signal of 0 to balance out the current increase dictated by the quantizer 401.

The Up/Down Counter 422 is reset at the beginning of each tuning process and counts the number of 1's and 0's that comprise the digital output of the quantizer 401. The output of the Up/Down Counter is also coupled to the current source $I_f$.

One difference between this structure as compared with a classical incremental converter is the use of two different types of integrators. The operation of the system allows for the accurate measurement of the time-constant of the continuous-time integrator.

The controllable current source 420 comprises a current source $I_f$ 403 that may be a replica of the current source 402, a voltage source $V_{ref2}$, an op-amp 404, a transistor 409, and a cascade of switched resistors coupled in series 406–408. A reference voltage $V_{ref2}$ is coupled to the input of an operational amplifier 404, the output of which is coupled to the gate of transistor 409. The drain of transistor 409 is coupled to a current source $I_f$ 403, which is a mirror of the current source 402. The source of the transistor 409 is coupled to a cascade of switched resistors 406–408 coupled in series. The current sources 402, 403 are shown as current sources to identify the points in the circuit at which the currents are measured and matched. When the circuits are implemented, there may not actually be a physical current source present at these points.

The switched resistors 406–408 receive input from the Up/Down counter 422 of FIG. 4, where $d_0$, $d_1$, and $d_M$ are all a part of D, the digital signal that is the output of the Up/Down counter 422. This variable resistance tunes the current $I_f$ in conjunction with the tuning circuit of FIG. 4 by adjusting the equivalent resistance of the circuit. Current sources 402, 403 may be generated from a current mirror or be the same current source as the values of both current sources 402, 403 may be identical. The cascade of switched resistors 406–408 receives input from the tuning circuit 310 and is controlled by tuning circuit 310. Although a specific embodiment for controllable current source 420 is shown, it will be understood that other forms of a controllable current source may be substituted here.

The reference voltage $V_{ref1}$ may be used in place of the reference voltage $V_{ref2}$. The resistors in the cascade of switched resistors 406–408 may all have the same value or may be of differing values, and the number of switched resistors in the cascade may vary, according to the needs of the design. In one embodiment of the invention, each resistor may have double the resistance value of the resistor preceding it, with the lowest value resistor being coupled closest to the transistor 409.

All of the transconductors 300, 301 and current sources 302, 303 in the ΣΔ-modulator in FIG. 3 are matched with the tuned current source by adjusting their passive devices, e.g., resistors, that are controlled by the same digital code. In another embodiment of the present invention, each tunable passive device of the transconductors 300, 301 and current sources 302, 303 in the ΣΔ-modulator may be controlled by different digital codes.

In one embodiment of the invention, the digitally tuned CT-sigma-delta-modulator may be combined with a common-mode feedback circuit to form a CT-sigma-delta-modulator with discrete-time common mode feedback, as described in application Ser. No. 10/324,684, filed on Dec. 19, 2002, entitled Continuous-Time Sigma-Delta Modulator with Discrete Time Common-Mode Feedback, hereby incorporated by reference in its entirety.

In another embodiment of the present invention, the tuning of the continuous-time modulator may take place simultaneously with the ordinary processes of the continuous-time modulator. Embodiments of the present invention may be implemented in the field of wireless communications, specifically in cellular phones.

EXAMPLES

Specific embodiments of the invention will now be further described by the following, nonlimiting examples which will serve to illustrate in some detail various features. The following examples are included to facilitate an understanding of ways in which the invention may be practiced. It should be appreciated that the examples which follow represent embodiments discovered to function well in the practice of the invention, and thus can be considered to constitute preferred modes for the practice of the invention. However, it should be appreciated that many changes can be made in the exemplary embodiments which are disclosed while still obtaining like or similar result without departing from the spirit and scope of the invention. Accordingly, the examples should not be construed as limiting the scope of the invention.

Example 1

Figure 6:
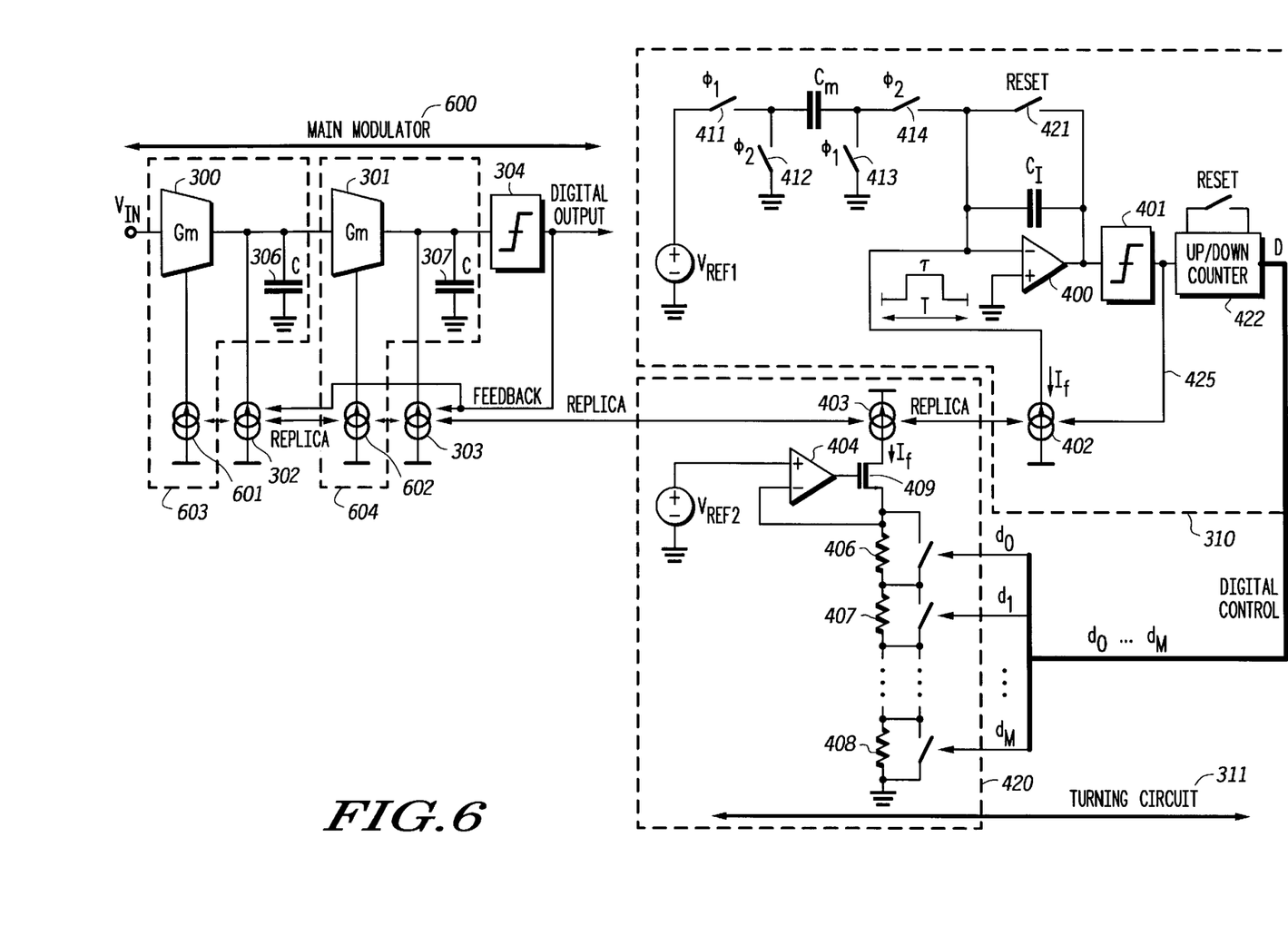
FIG. 6 is second-order continuous-time sigma-delta-modulator using GmC integrators and a tuning circuit, in accordance with an embodiment of the present invention.

FIG. 6 shows a digitally tuned $\Sigma\Delta$-modulator 600 that uses operational transconductance amplifiers (OTAs). The main modulator 600 is a second order modulator, implemented with two GmC-integrators 603, 604 in series. $V_{in}$ is coupled to the OTA 300 which also receives input from current source 601. The output of the OTA 300 is coupled with a current source 302, a capacitor 306, and a second OTA 301. The second OTA 301 also receives input from a current source 602 and its output is coupled to a current source 303, a capacitor 307, and then to a quantizer 304 before being fed back to the circuit through current sources 302–303.

The tuning circuit 311 is comprised of a digital tuning circuit 310 and the controllable current source 420 previously discussed. The tuning circuit and the main modulator are linked by their current sources. Like in the tuning circuit shown in FIG. 4 where current sources 402 and 403 are mirrors of each other, current sources 601, 602, 302, and 303 are mirrors of each other and also to current sources 402–403. In effect, this may cause the current sources to have a pre-determined ratio between each other.

Example 2

Figure 7:
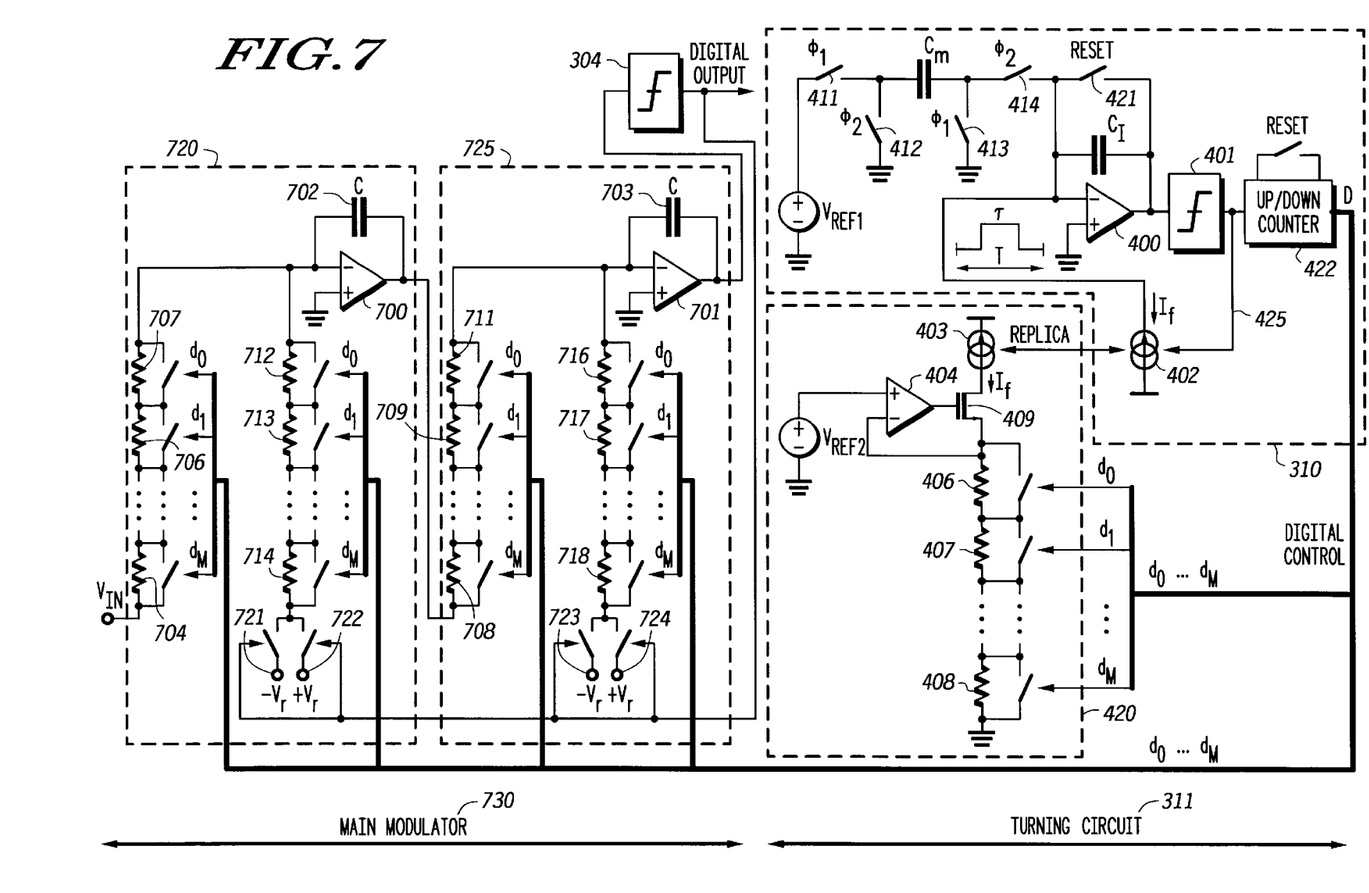
FIG. 7 is a second-order continuous-time sigma-delta-modulator active RC-integrators and a tuning circuit, in accordance with an embodiment of the present invention.

FIG. 7 shows a digitally tuned $\Sigma\Delta$-modulator 730 that uses op-amps. The main modulator 730 is a second order modulator, implemented with two RC-integrators 720, 725 in cascade. $V_{in}$ is coupled to the cascade of switched resistors 704, 706, 707 which is coupled to the input of the op-amp 700. The cascade of switched resistors 704, 706, 707 is coupled to a capacitor 702 that is also coupled to the output of the op-amp 700. The capacitor 702, the cascade of switched resistors 704, 706, 707, and the input of the op-amp 700 is coupled to a second cascade of switched resistors 712–714, where switched-resistor 714 is coupled to voltage inputs 721–722.

The output of the op-amp 700 is coupled to switched resistor 708, a component of the cascade of switched resistors 708, 709, 711, which is coupled to the input of the op-amp 701. The cascade of switched resistors 708, 709, 711 is coupled to a capacitor 703 that is also coupled to the output of the op-amp 701. The capacitor 703, the cascade of switched resistors 708, 709, 711, and the input of the op-amp 701 is coupled to a second cascade of switched resistors 716–718, where switched-resistor 718 is coupled to voltage inputs 723–724. The voltage inputs 721–724 are generated by a reference circuit that is not shown here. The reference circuit is used when converting an analog signal to a digital signal.

The output of the op-amp 701 is coupled to the quantizer 304. The output of the quantizer 304 is fed back to the circuit through the voltage inputs 721–724. The cascades of switched-resistors 704–707, 712–714, 708–711, 716–718 all receive input from the Up/Down Counter 422 in the Tuning Circuit, which controls the switching of the resistors 704, 706–709, 711–714, 716–718.

The tuning circuit is comprised of a digital tuning circuit 310 and the controllable current source 420 previously discussed. The tuning circuit and the main modulator are linked by their current sources. Like in the tuning circuit where current sources 402 and 403 are mirrors of each other, the resistors making up the cascade of switched resistors 406–408 are replicas of the resistors making up the cascades of switched resistors 704–707, 712–714, 708–711, 716–718. In effect, this causes the resistors to be approximately identical to each other.

The terms a or an, as used herein, are defined as one or more than one. The term plurality, as used herein, is defined as two or more than two. The term coupled, as used herein, is defined as connected, although not necessarily directly, and not necessarily mechanically.

All the disclosed embodiments of the invention disclosed herein can be made and used without undue experimentation in light of the disclosure. It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

What is claimed is:

1. A method for tuning a continuous-time modulator, comprising:

supplying a voltage source and a controllable current source;

integrating a voltage from the voltage source using a discrete-time integrator to produce a discrete-time integrator output;

continuous-time integrating a current from the controllable current source to produce a continuous-time integrator output;

quantizing the difference between the continuous-time integrator output and the discrete-time integrator output to produce a quantizer output;

controlling a polarity of the controllable current source with the quantizer output;

counting the quantizer output to produce a feedback signal; and tuning the controllable current source as a function of the feedback signal.

2. The method of claim 1, wherein tuning the controllable current source comprises adjusting a resistance of the current source using the feedback signal.

3. The method of claim 1, further comprising matching all gains of operational amplifiers in the continuous-time modulator by tuning the controllable current source.

4. The method of claim 1, further comprising matching all continuous-time modulator current sources to the controllable current source.

5. The method of claim 1, wherein the feedback signal is a digital code.

6. The method of claim 5, further comprising storing the digital code.

7. The method of claim 5, further comprising using the digital code during regular operation of the continuous-time modulator to tune the continuous-time modulator.

8. The method of claim 5, further comprising using the digital code to control passive devices in the continuous-time modulator.

9. The method of claim 8, wherein the passive devices are resistors.

10. An apparatus for a continuous-time modulator tuning circuit, comprising:

a discrete-time integrator in a fixed forward path;

a continuous-time integrator in a feedback path;

a quantizer coupled to receive input from the discrete-time integrator and the continuous-time integrator;

a counter coupled to receive input from the quantizer;

a controllable current source coupled to receive input from the counter and to provide input to the continuous-time integrator; and an input voltage coupled to provide input to the discrete-time integrator.

11. The apparatus of claim 10, wherein the controllable current source comprises:

an operational amplifier;

an input voltage coupled to provide input voltage to the operational amplifier;

a transistor coupled to receive the output from the operational amplifier;

a plurality of switched-resistors coupled to receive input from the transistor and providing input to the operational amplifier to adjust an equivalent resistance to adjust a current output of the controllable current source.

12. The apparatus of claim 10, further comprising a continuous-time modulator current source coupled to the input of the continuous-time modulator.

13. The apparatus of claim 12, wherein the continuous-time modulator current source is a mirror of the controllable current source.

14. The apparatus of claim 10, the controllable current source comprising a continuous-time modulator current source.

15. The apparatus of claim 10, the discrete-time integrator and the continuous-time integrator using a common amplifier.

* * * * *